US007265006B2

(12) United States Patent
Augusto et al.

(10) Patent No.: US 7,265,006 B2
(45) Date of Patent: Sep. 4, 2007

(54) METHOD OF FABRICATING HETEROJUNCTION DEVICES INTEGRATED WITH CMOS

(75) Inventors: Carlos J.R.P. Augusto, San Jose, CA (US); Lynn Forester, San Jose, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 0 days.

(21) Appl. No.: 11/176,538

(22) Filed: Jul. 7, 2005

(65) Prior Publication Data

US 2005/0255649 A1 Nov. 17, 2005

Related U.S. Application Data

(63) Continuation-in-part of application No. 10/399,495, filed as application No. PCT/EP01/11817 on Oct. 12, 2001, now Pat. No. 6,943,051.

(60) Provisional application No. 60/241,551, filed on Oct. 19, 2000.

(51) Int. Cl.
  *H01L 21/337* (2006.01)
(52) U.S. Cl. ............... 438/191; 438/194; 438/199
(58) Field of Classification Search ........... 438/59, 438/48, 60, 314, 170, 191, 194, 197, 199, 438/189, 188, 186, 203, 58, 30
See application file for complete search history.

(56) References Cited

U.S. PATENT DOCUMENTS

| 5,557,121 | A | | 9/1996 | Kozuka |
| 5,686,734 | A | | 11/1997 | Hamakawa |
| 5,985,689 | A | | 11/1999 | Gofuku |
| 6,058,229 | A | | 5/2000 | Burrows |
| 6,091,127 | A | | 7/2000 | Chandra |
| 6,580,104 | B1 | * | 6/2003 | U'Ren ............... 257/205 |

OTHER PUBLICATIONS

Vonsovici et al. "Room Temperature Photocurrent Spectroscopy of SiGe/Si p-i-n Photodiodes Grown by Selective Epitaxy", IEEE Transactions on Electron Devices, vol. 45, No. 2, 2002.

* cited by examiner

*Primary Examiner*—Howard Weiss
*Assistant Examiner*—(Vikki) Hoa B. Trinh
(74) *Attorney, Agent, or Firm*—Sturm & Fix LLP

(57) ABSTRACT

A method of fabricating heterojunction devices, in which heterojunction devices are epitaxially formed on active area regions surrounded by field oxide regions and containing embedded semiconductor wells. The epitaxial growth of the heterojunction device layers may be selective or not and the epitaxial layer may be formed so as to contact individually each one of a plurality of heterojunction devices or contact a plurality of heterojunction devices in parallel. This method can be used to fabricate three-terminal devices and vertically stacked devices.

26 Claims, 11 Drawing Sheets

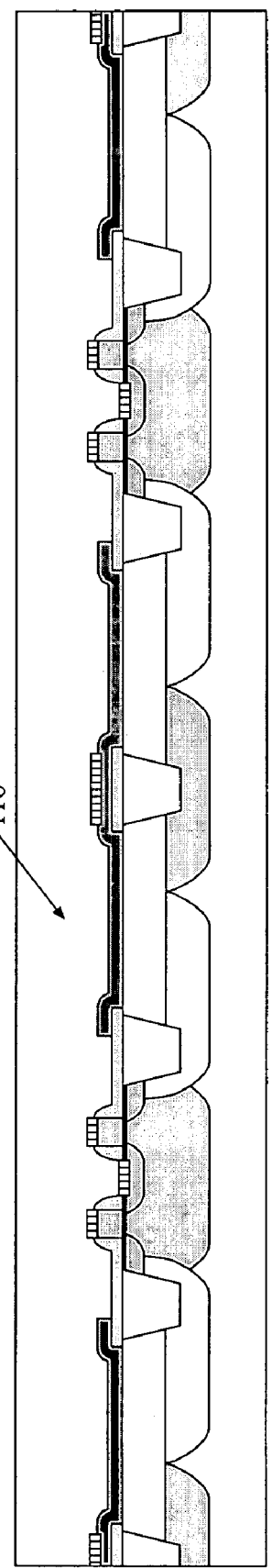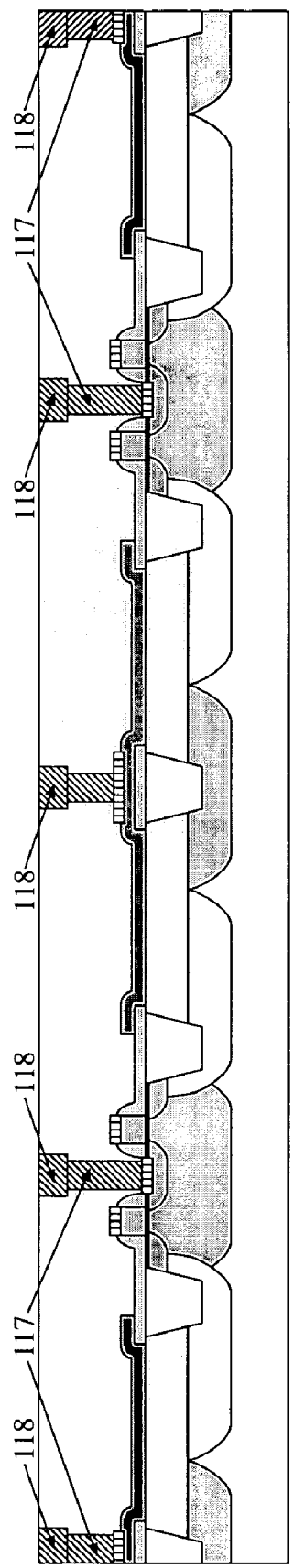
FIG. 6G
FIG. 6H 105   101   104   103

109   107

METHOD OF FABRICATING HETEROJUNCTION DEVICES INTEGRATED WITH CMOS

This application is a continuation-in-part of U.S. patent application Ser. No. 10/399,495, filed Apr. 17, 2003, now U.S. Pat. No. 6,943,051, which claims the benefit of PCT/EP01/11817 filed Oct. 12, 2001 and U.S. provisional patent application 60/241,551 filed Oct. 19, 2000.

BACKGROUND OF THE INVENTION

Several electronic, opto-electronic and photonic devices can benefit, in terms of higher performance and added functionality, from precisely engineered doping and heterojunction profiles, at least for the most critical active layers. Such precisely engineered layers cannot be made with the junction-formation methods used by conventional CMOS technology.

Conventional CMOS processing, which has been extended to the sub-100 nm technology generations, essentially relies on ion-implantation and rapid thermal annealing to make increasingly shallower and higher doped junctions.

Low temperature epitaxial growth (selective or non-selective), which can be achieved through many techniques such as Molecular Beam Epitaxy (MBE) and Chemical Vapor Deposition (CVD), each with many sub-variants, is the only fabrication method capable of realizing the precise doping and heterojunction profiles needed by advanced devices.

SiGe (and SiGeC) BiCMOS has introduced the epitaxy of silicon-germanium (and silicon-germanium-carbon) films to the CMOS processing line. Even though SiGe BiCMOS is a monolithically integrated technology, the SiGe Heterojunction Bipolar Devices (HBTs) require many additional masks and processing steps, which simultaneously increase the complexity and cost. On the other hand, HBTs are made on their own active areas, and are not tightly integrated with the CMOS devices. This is a critical point to enable new devices with pattern density similar to that of pure CMOS technology.

Co-pending patent application Ser. No. 10/399,495 introduced a method of fabrication of photodiodes monolithically integrated with CMOS, which achieved the goal of a very tight integration of the devices comprising the epitaxial layer (part of the photo-diodes) with the CMOS devices. The method of fabrication disclosed in said co-pending application provides the guidelines for the insertion of epitaxial growth of device layers onto CMOS active areas, in a manner and at a point of the CMOS process flow, resulting in the following:

1. The insertion of the epitaxial growth step has minimal impact on the overall "Front End" and "Back End" standard process flow of CMOS devices, and on the operation of said CMOS devices.
2. The epitaxial layers suffer a minimal impact from the CMOS processing, because the epitaxial growth step is inserted after all high-temperature steps characteristic of CMOS "Front End" processing.

Co-pending patent application Ser. No. 10/399,495 also mentions that the insertion point for the epitaxial growth process, being after all high temperature steps of the "Front End" processing of CMOS, is ideally suitable for the introduction of materials, other than SiGeC and related alloys, that have been demonstrated to be epitaxially compatible with silicon having the (100) or (111) crystallographic orientations. The list of materials includes (among many others) PbTe, ZnS, GaN, AlN, $Al_2O_3$, $LaAlO_3$, $Pr_2O_3$, $CeO_2$, $CaF_2$, $Sr_2TiO_4$, etc.

Said co-pending patent application describes an exemplary implementation of the method of fabrication of devices on bulk silicon substrates. The present application provides more details about said method of fabrication and an explicit description of the implementation of said method of fabrication to thick-film silicon-on-insulator substrates.

The present application also discloses small variations and derivations of said method of fabrication to enable more types of devices comprising epitaxial layers, to be monolithically integrated with CMOS, for example, devices such as avalanche photo-diodes for light absorption, avalanche photo-diodes for light emission, vertically stacked multiple photo-diodes, Heterojunction Bipolar Devices and Photo-Heterojunction Bipolar Devices, Heterojunction Gunn Diodes, Heterojunction IMPATT Diodes, etc.

In the remainder of the present disclosure, "photo-diode" or "photo-diode layers" are used in a non-restrictive way, as to encompass avalanche photo-diodes that can absorb and/or emit light, and/or other optoelectronic/photonic epitaxial layers/devices that do not require avalanche processes for light absorption and emission. Similarly "pixel" and "pixel cells" should be construed to mean "cells" with one or more devices that can absorb and/or emit light. Such optoelectronic/photonic devices, made according to the method of fabrication of co-pending patent application Ser. No. 10/399,495, are described in Provisional Patent Application No. 60/591,658, filed on Jul. 28, 2004.

SUMMARY OF THE INVENTION

It is an object of this application is to explicitly show how to establish a conductive path to the bottom electrode of devices made according to the fabrication method described in co-pending patent application Ser. No. 10/399,495. Such contact was mentioned in said patent application, but was not explicitly shown in the figures.

Another object of this application is to present an exemplary process flow implementing the method of fabrication described in co-pending patent application Ser. No. 10/399,495 on bulk silicon substrates, in which the epitaxial growth process is non-selective.

Yet another object of this application is an implementation of the method of fabrication described in co-pending patent application Ser. No. 10/399,495 on Thick-Film Silicon-On-Insulator (SOI) substrates.

Yet another object of this application is an adaptation to the method of fabrication described in co-pending patent application Ser. No. 10/399,495, in which the epitaxial deposition step comprises two layers, one suitable to be the "Base" and the other suitable to the "Emitter" of a three terminal device, such as a Heterojunction Bipolar Transistor (HBT) or a Photo-Heterojunction Bipolar Transistor. Such an adaptation provides a simplified SiGe BiCMOS process flow, requiring significantly fewer masks and process steps than conventional SiGe BiCMOS flows, and therefore having much lower cost of fabrication. This adaptation can also be applied to the implementation of the fabrication method on Thick-film SOI wafers.

A further object of this application is an adaptation to the method of fabrication described in co-pending patent appli cation Ser. No. 10/399,495, in which the epitaxial deposition step comprises several layers, with suitable doping and bandgap engineering, resulting in vertically stacked distinct photo-diodes, each capturing a pre-defined range of wavelengths.

BRIEF DESCRIPTION OF THE DRAWINGS

FIG. 6A to 6H, show a process flow analogous to that of co-pending patent application Ser. No. 10/399,495, but with non-selective growth of the epitaxial layer. The figures show the process flow for two "pixel cells". Each "pixel cell" comprises two pixels. A pixel comprises one photo-diode and one MOSFET device.

DESCRIPTION OF EMBODIMENTS OF THE INVENTION

As with the process flow described in co-pending patent application Ser. No. 10/399,495, all exemplary process flows described below assume standard processing for a given CMOS generation, until the point at which the epitaxial growth of the layer(s) is to take place: after all ion-implantation and high temperature annealing steps have been performed, and just before the "silicide" module.

The insertion point for the epitaxial step is the ideal one to avoid dopant diffusion, and to enable highly strained films and materials, which cannot withstand the typical high temperature steps used in the "Front End" of CMOS processing.

However, the insertion point could also be a little earlier in the process flow, such as after the ion-implantation for Lightly Doped Drain (LDD) and before the implant for Highly Doped Drain (HDD). Such insertion point would put more restrictions on the materials and strain used in the epitaxial layer.

Method of Contacting the Bottom Electrode of the Epitaxial Device

In co-pending patent application Ser. No. 10/399,495, it is explicitly mentioned that the contact to the bottom electrode of the epitaxial photo-diode, is made similarly to the way that contacts to "wells" are made in standard CMOS technology.

Figure 1:
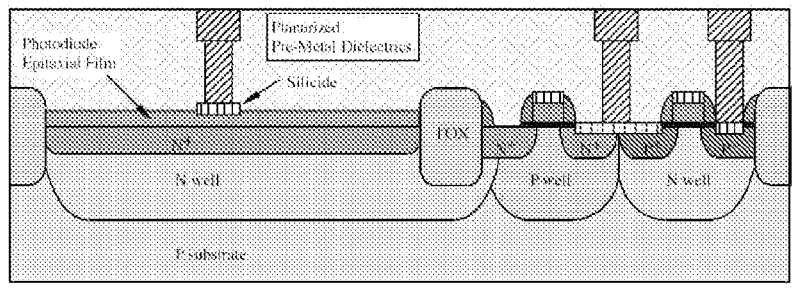
FIG. 1 shows a schematic cross section view of a processed bulk silicon p-type substrate after completion of the "Front End" processing, and up to the first level of metallization.

FIG. 1 shows a schematic cross section view of a processed bulk silicon p-type substrate after completion of the "Front End" processing, and up to the first level of metallization. In this cross section view, the epitaxial layers are shown as having been produced by a Selective Epitaxial Growth (SEG) process.

The present disclosure shows explicitly how the contact to the bottom electrode of the epitaxial device (e.g. a: photo-diode) can be made. FIGS. 2 to 5 illustrate two alternative methods of making such contact. Both methods rely on the "well implant" to overlap both sides of the shallow trench isolation to provide a conductive path under said shallow trench isolation.

Figure 2:
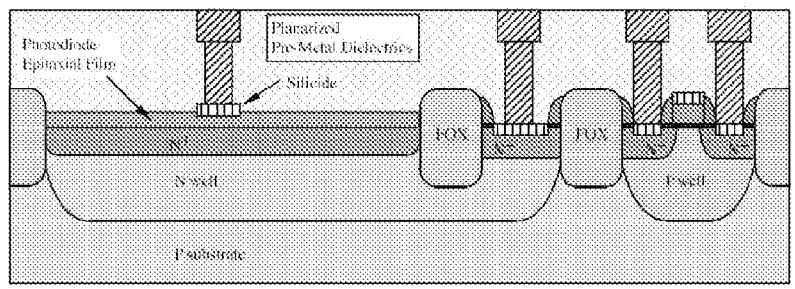
FIG. 2 shows a schematic cross section view, orthogonal to the cross section view illustrated in FIG. 1, in which one possible method of contacting the bottom electrode of the photo-diode is shown.

FIG. 2 shows a schematic cross section view, orthogonal to the cross section view of FIG. 1, in which the contact to the bottom electrode of the epitaxial device is made by a direct ohmic contact to a surface region that is highly doped, with the same type of impurity as the potential well under the isolation oxide (FOX). The figure shows an epitaxial layer formed by the selective epitaxial growth (SEG) process, with a contact to the top electrode of the epitaxial device made at the center of the respective active area.

Figure 3:
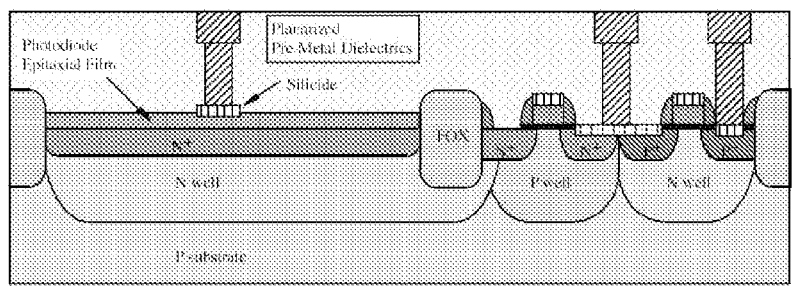
FIG. 3 shows a schematic cross section view, orthogonal to the cross section view of FIG. 1, in which a second possible method of contacting the bottom electrode of the photo-diode is shown.

FIG. 3 shows a schematic cross section view, orthogonal to the cross section view shown in FIG. 1, in which the contact to the bottom electrode of the epitaxial device is made by the overlap of the potential well (for example N-type) underneath the bottom electrode of the epitaxial layer, and the source/drain region of a MOSFET formed on an adjacent complementary potential well (for example P-type). The figure shows an epitaxial layer formed by the selective epitaxial growth (SEG) process, with a contact to the top electrode of the epitaxial device made at the center of the respective active area.

Figure 4:
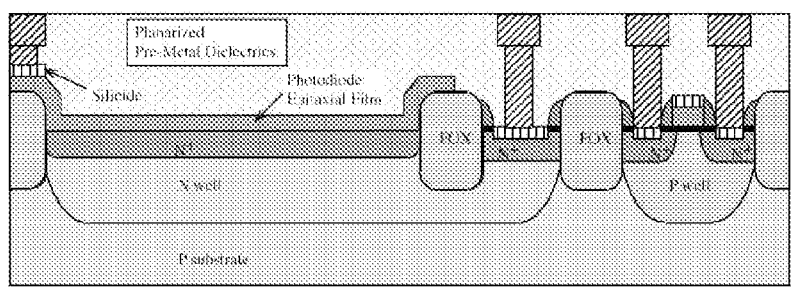
FIG. 4 shows a schematic cross section view, similar to that of FIG. 2, but with an epitaxial layer grown non-selectively, with contacts to the epitaxial layer being made over the isolation areas.

FIG. 4 shows a schematic cross section view, orthogonal to the cross section view shown in FIG. 1, in which the contact to the bottom electrode of the epitaxial device is made by a direct ohmic contact to a surface region that is highly doped, with the same type of impurity as the potential well under the isolation oxide (FOX). The figure shows an epitaxial layer formed by a non-selective epitaxial growth process, with a contact to the top electrode of the epitaxial device made at the edge of the respective active area, over a region of oxide isolation.

Figure 5:
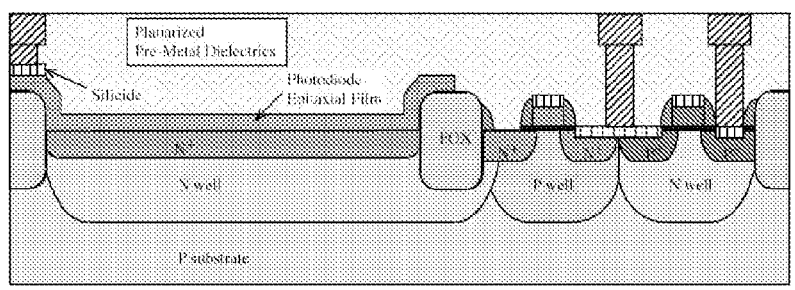
FIG. 5 shows a schematic cross section view, similar to that of FIG. 3, but with an epitaxial layer grown non-selectively, with contacts to the epitaxial layer being made over the isolation areas.
Figure 6A:
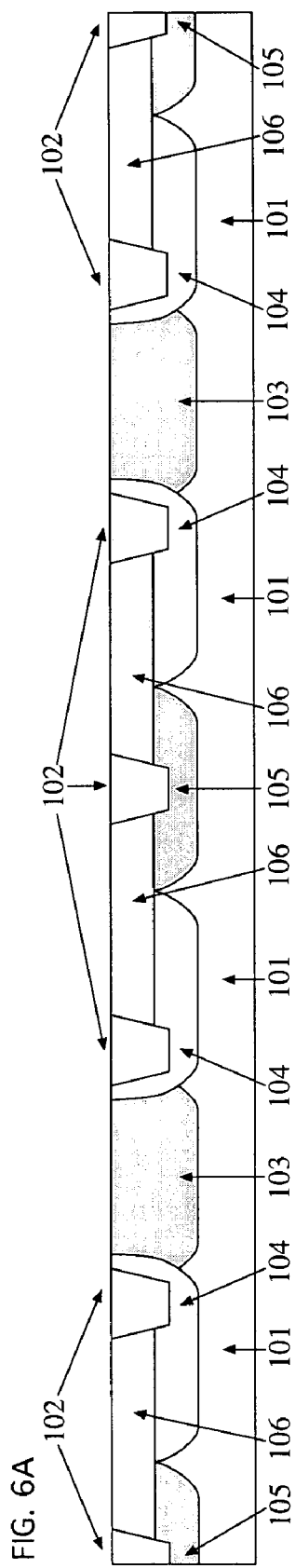
Figure 6B:
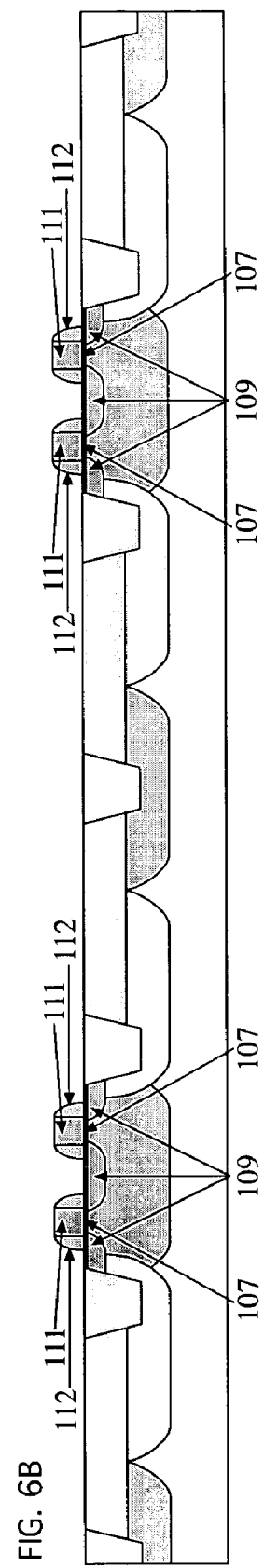
Figure 6C:
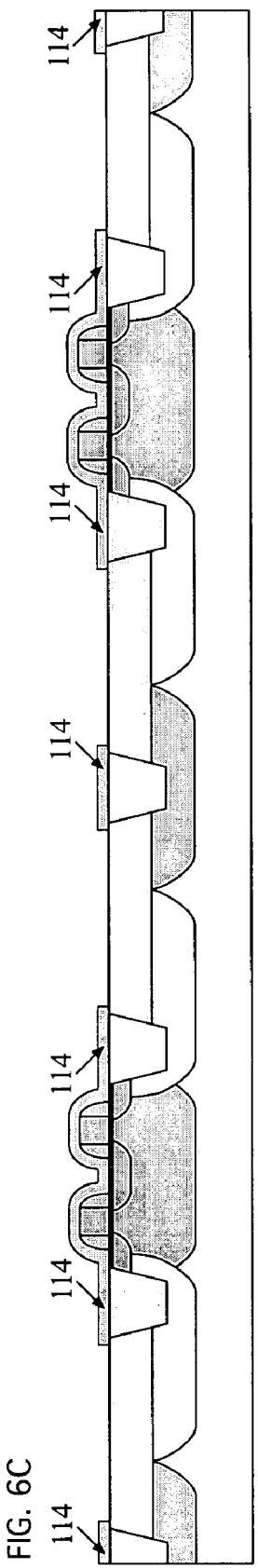
Figure 6D:
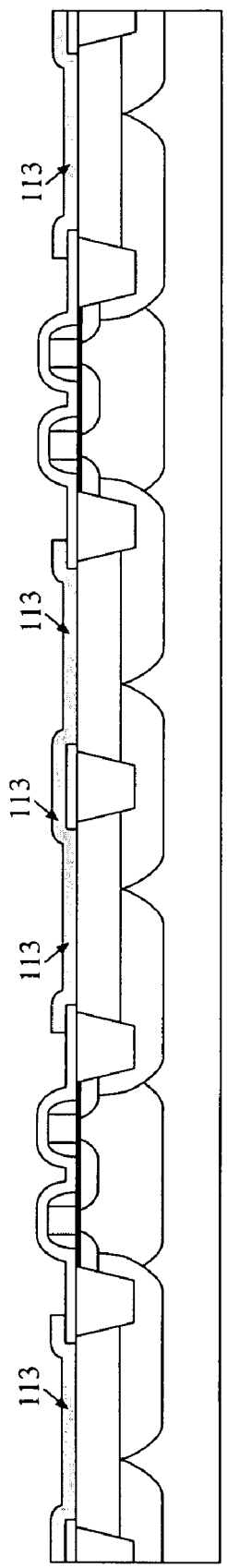
Figure 6E:
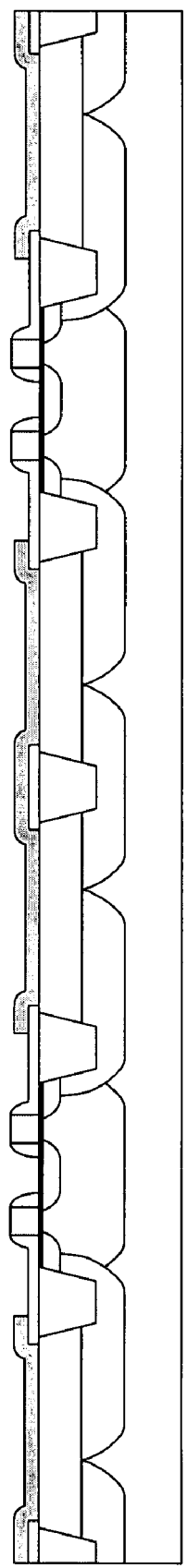
Figure 6F:
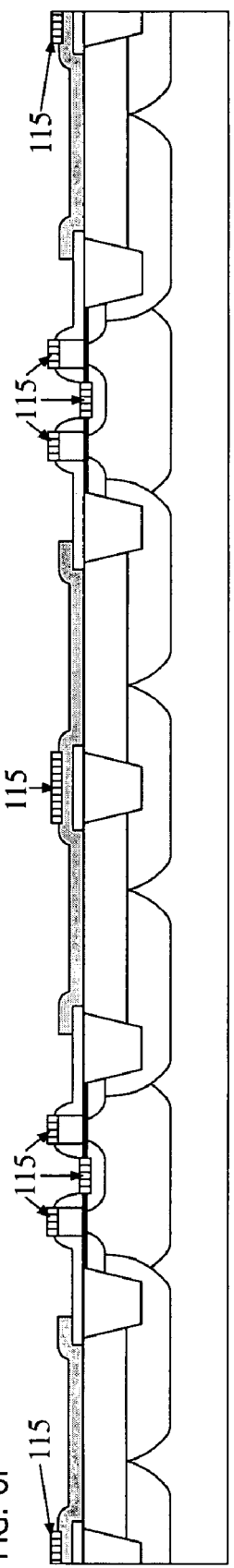
Figure 7A:
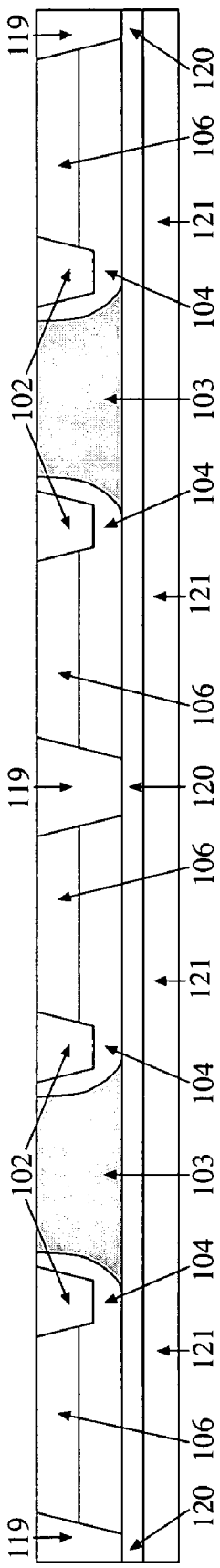
FIG. 7A to 7H, show a process flow similar to the one described in FIG. 6A to 6F, except that it is implemented on thick-film SOI substrates, in which deep trench isolation is used to isolate adjacent "pixel cells".
Figure 7B:
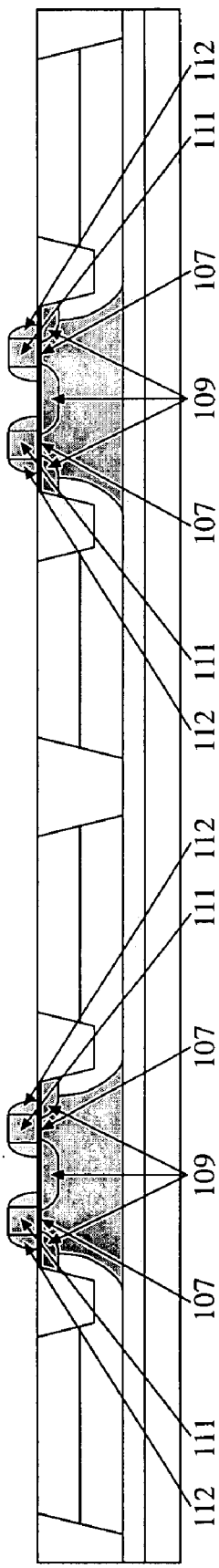
Figure 7C:
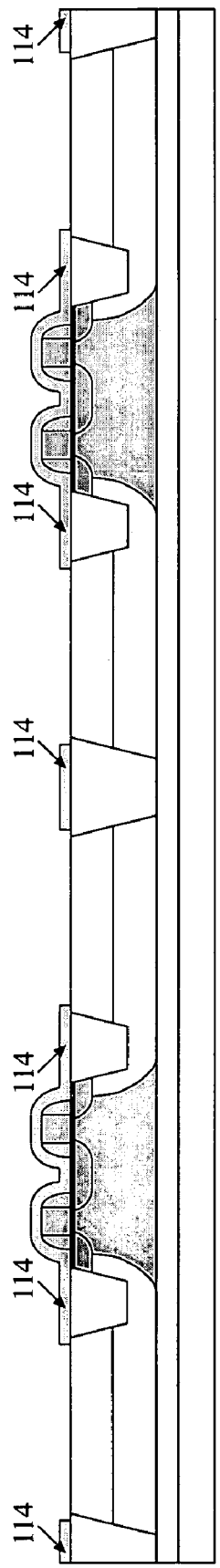
Figure 7D:
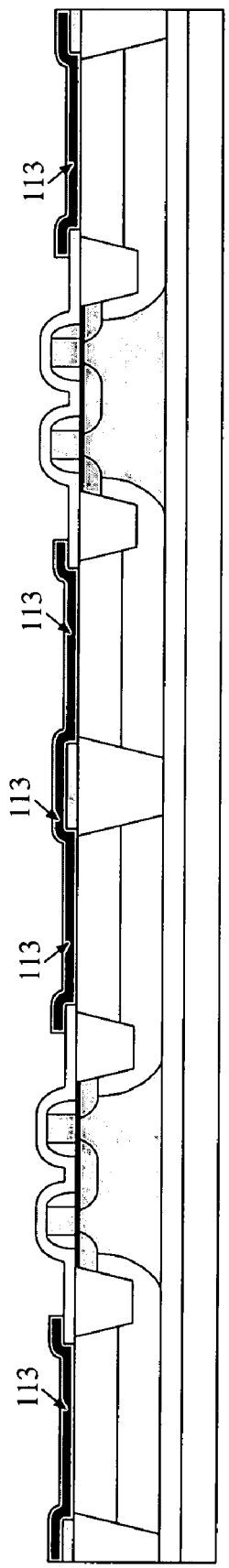
Figure 7E:
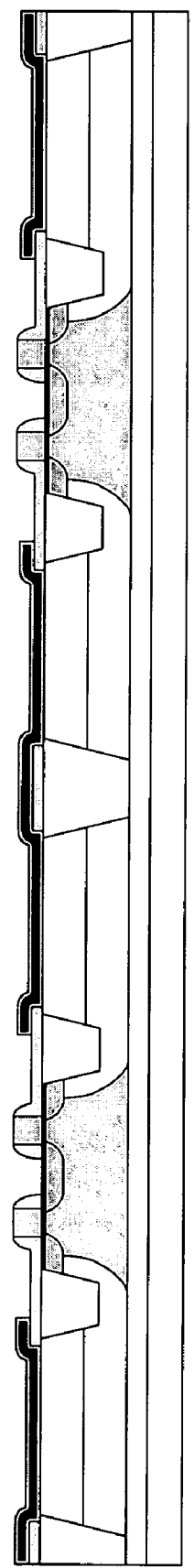
Figure 7F:
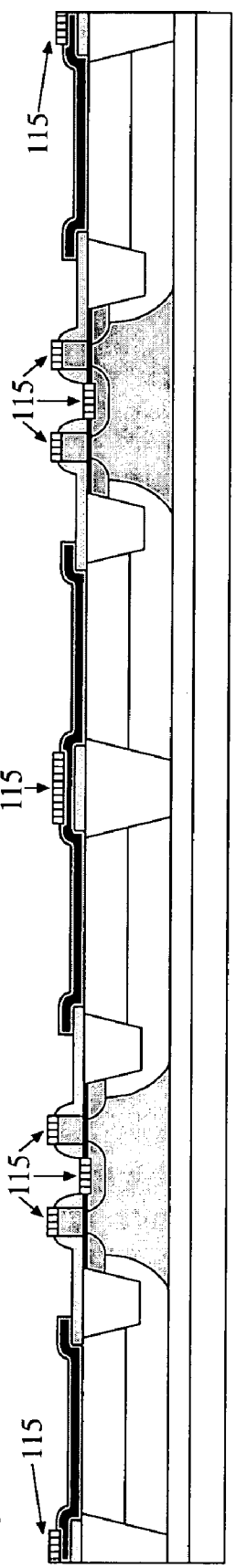
Figure 7G:
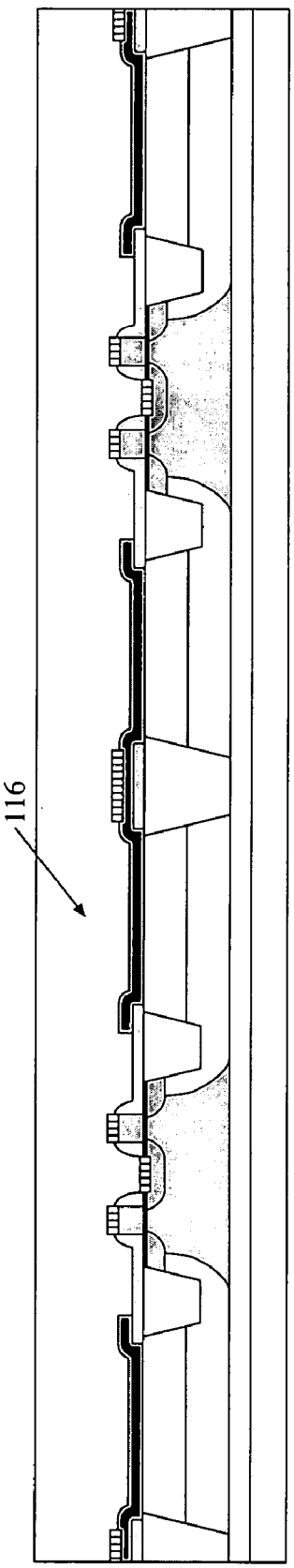
Figure 7H:
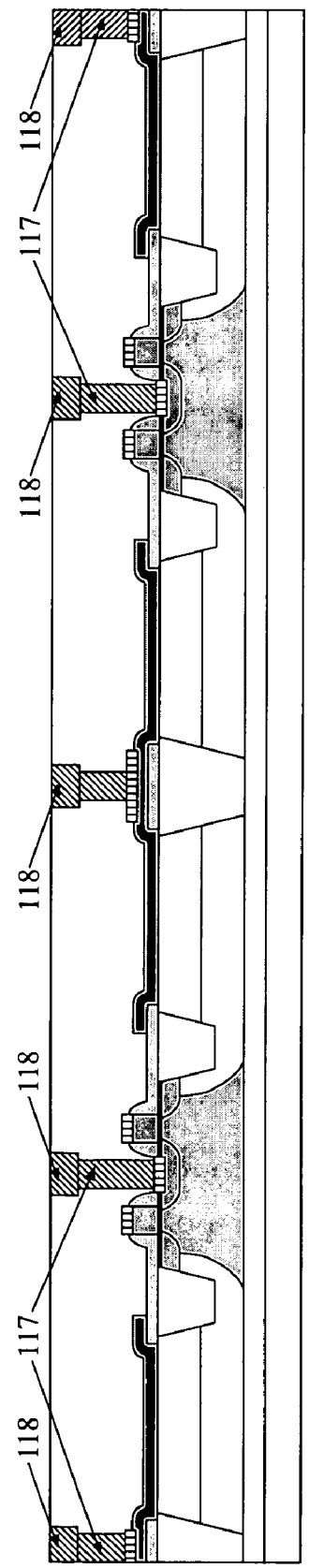
Figure 8A:
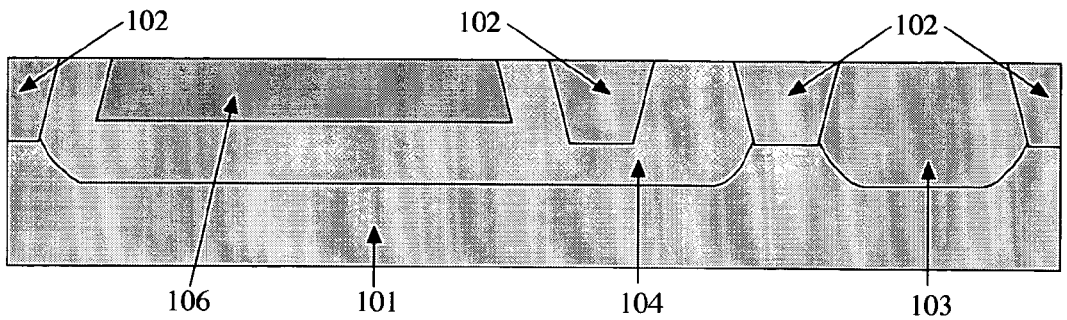
FIG. 8A to 8H, show a process flow identical to that described in FIG. 6A to 6F, except that the epitaxial layer comprises two distinct layers that can be used as the "Base" and "Emitter" layers of a Heterojunction Bipolar Transistor or a Photo-Heterojunction Bipolar Transistor.
Figure 8B:
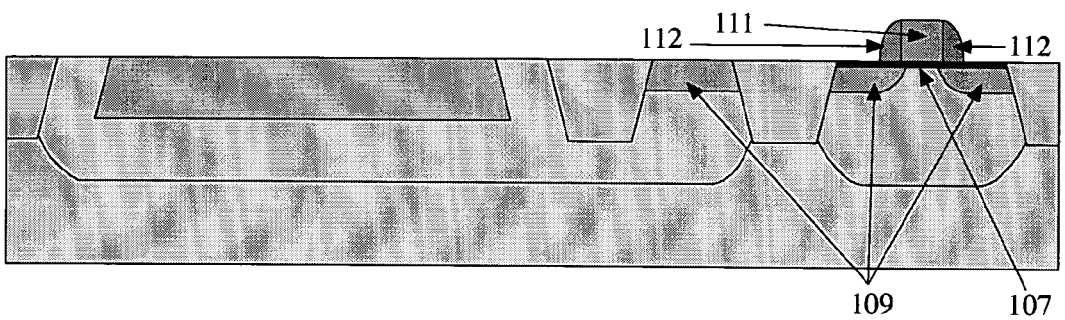
Figure 8C:
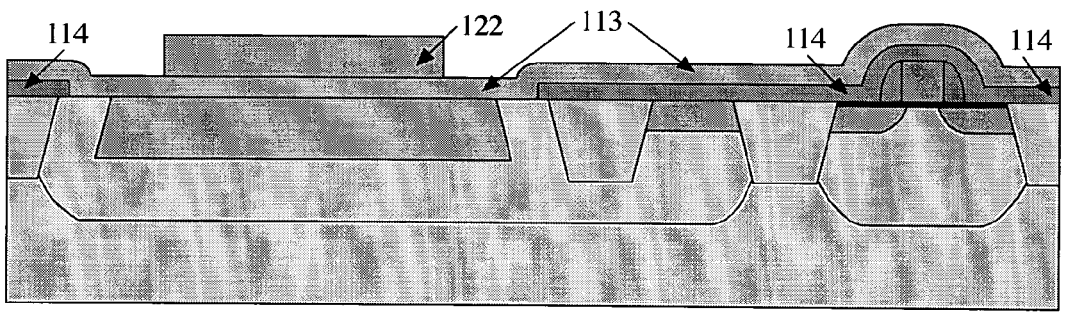
Figure 8D:
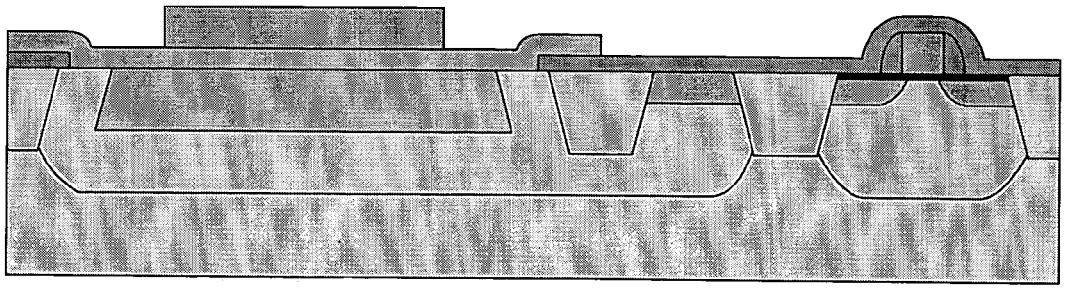
Figure 8E:
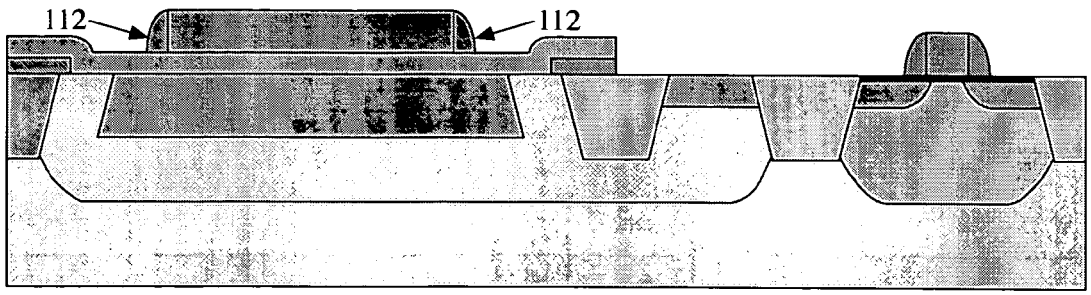
Figure 8F:
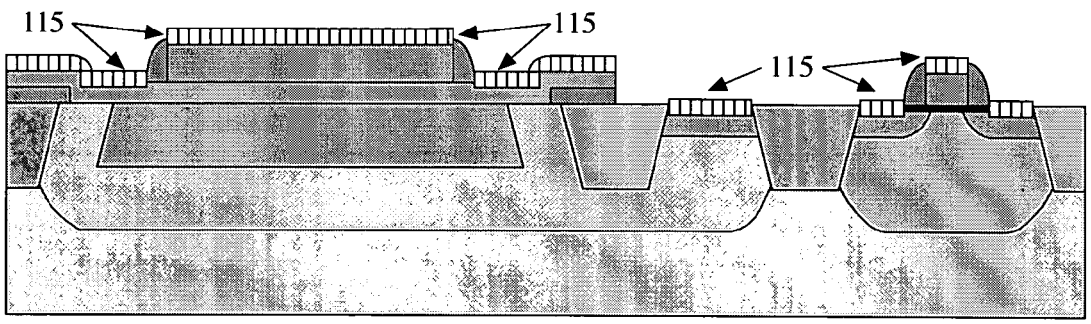
Figure 8G:
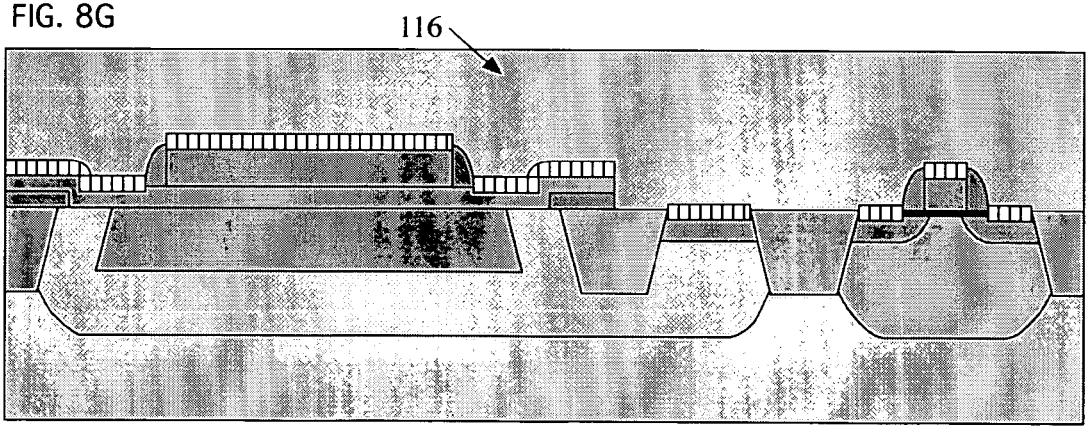
Figure 8H:
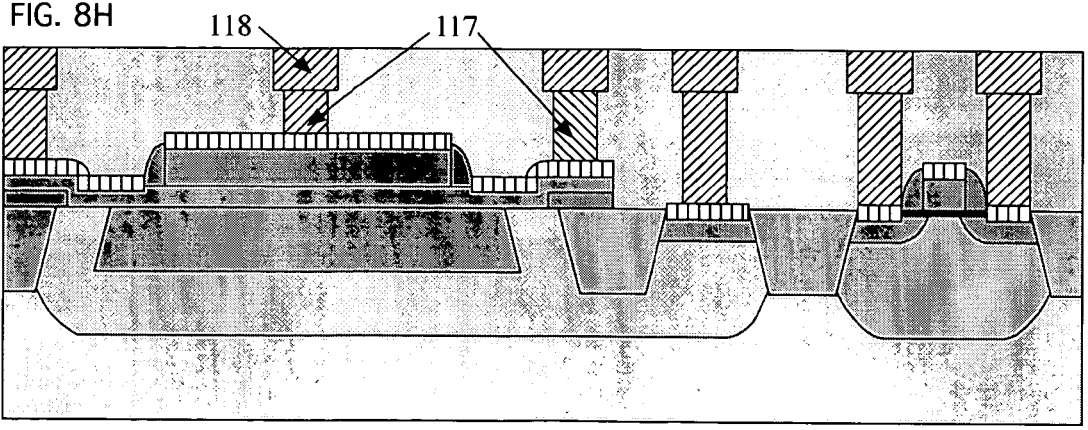

FIG. 5 shows a schematic cross section view, orthogonal to the cross section view shown in FIG. 1, in which the contact to the bottom electrode of the epitaxial device is made by the overlap of the potential well (for example N-type) underneath the bottom electrode of the epitaxial layer, and the source/drain region of a MOSFET formed on an adjacent complementary potential well (for example P-type). The figure shows an epitaxial layer formed by a non-selective epitaxial growth process, with a contact to the top electrode of the epitaxial device made at the edge of the respective active area, over a region of oxide isolation.

Both these methods can be implemented with N-Wells on P-type substrates, and also with P-Wells on N-type substrates. Depending on the type of substrate and the polarity of the well implant, the polarity of the semiconductor underneath the epitaxial layer, as well as the epitaxial layer itself, must have the suitable polarities also.

The examples shown in the figures present the most common type of substrate used for CMOS processing, which is P-type substrate, N-type well, n-type silicon underneath the epitaxial layer, and p-type doped $Si_{1-x-y}Ge_xC_y$ epitaxial layer, which is also the most commonly used doping type for the fabrication of silicon-based Heterojunction Bipolar Transistors (HBTs). This due to the unique kind of band alignment, which is a band offset mainly in the valence band, obtained with such (germanium-rich) layers strained to the silicon lattice.

Reverting the polarity of the different layers is possible, and a correspondingly suitable heterojunction band alignment, which is a band offset mainly in the conduction band, can be obtained with strained $Si_{1-y}C_y$ layers or carbon-rich $Si_{1-x-y}Ge_xC_y$ layers.

Both these methods are applicable to bulk silicon substrates, as well as to thick-film silicon-on-insulator substrates, in which it is possible to make a conductive path between two adjacent active areas, underneath the shallow trench isolation.

These methods are also applicable when the epitaxial layers are not SiGeC-related alloys, but any of the other materials epitaxially compatible with the silicon substrates.

The adaptation of the method of fabrication described in co-pending patent application Ser. No. 10/399,495 to thin-film SOI substrates has been disclosed in international publication WO 2004/027879.

Process Flow with Non-Selective Epitaxial Growth

The present application presents an exemplary process flow, implementing the method of fabrication described in co-pending patent application Ser. No. 10/399,495 on bulk silicon substrates, in which the epitaxial growth process is non-selective. This type of epitaxial deposition was also mentioned in the description in said patent application, but was not illustrated in the accompanying drawings.

Depending on the preferences for device interconnection, the epitaxial layer may, or may not, have to be patterned with the purpose of having said epitaxial layer of each optoelectronic/photonic device (e.g. a photo-diode) contacted individually or in parallel for all optoelectronic/photonic devices. The exemplary flow described below with reference to FIGS. 6A to 6H shows a non-patterned epitaxial layer that provides a common top electrode for all optoelectronic/photonic devices. These drawings show two "pixel cells", with each "pixel cell" comprising two pixels. Each pixel is formed by one optoelectronic/photonic device and one MOSFET device.

With non-selective epitaxial growth, and with a common top electrode, the ohmic contacts to the epitaxial film can be made on regions over the (shallow or deep) isolation trenches.

On a bulk silicon substrate (101), do the following:
 1. Define active areas and form p- and n-Wells (FIG. 6A)
 1A. Use shallow trench isolation (102) to define CMOS active areas for NMOS transistors and photo-diodes;
 1B. Form p-Wells (103) for NMOS active areas;
 1C. Form n-Wells (104) for photo-diode active areas, with N-well implant overlapping both side of shallow trench isolation that separates the active areas for the NMOS and for the photo-diode; 1D. Form p-type doped regions (105), isolating adjacent photo-diode active areas;

2. Form Gates and Junctions of NMOS transistors (FIG. 6B)
 2A. Form gate oxide (107);
 2B. Deposit and pattern poly-silicon gate electrodes (111);
 2C. Perform ion-implantation for LDDs;
 2D. Deposit and etch back silicon nitride to form self-aligned spacers (112) on the photo-diodes;
 2E. Perform ion-implantation for HDDs and activate dopants through thermal annealing (109);
 3. "Pre-epitaxy processing" (FIG. 6C)
 3A. Deposit silicon nitride film (114) to be used as a hard mask for epitaxy. This silicon nitride film is deposited on top of a thin film of silicon oxide, thereby protecting the silicon substrate surface;
 3B. Photolithography, leaving without photo-resist only the regions in which the epitaxial growth of single crystal films is to take place;
 3C. Etch of silicon nitride film, stopping on thin silicon oxide film;
 3D. Photoresist strip and clean;
 3E. Removal of thin oxide from silicon surface, for example with Dilute-HF;
 4. "Deposition of Epitaxial Layers" (FIG. 6D)
 4A. Non-selective Epitaxial growth (113) of device layers (ex.: in-situ p-type doped SiGeC film);
 4B. Photolithography, leaving without photo-resist only the regions from which it is to be removed the poly-crystalline film, formed by the epitaxial growth over the silicon nitride surface;
 4C. Etch of poly-crystalline film (ex.: SiGeC);
 4D. Photoresist strip and clean;
 5. "Patterning of Epitaxial Layers" (FIG. 6E)
 5A. Photolithography, leaving without photo-resist only the regions from which silicon nitride is to be removed;
 5K. Etch of silicon nitride;
 5L. Photoresist strip and clean;
 6. "Silicide Module" (FIG. 6F)
 6A. Removal of thin oxide layer from poly-Si lines and junctions (e.g. with Dilute-HF);
 6B. Formation of silicide with conventional methods (115),
 7. "Planarization Module" (FIG. 6G)
 7A. Deposition of Pre-Metal Dielectric layer(s) (116);
 7B. Planarization;
 8. "Metallization" (FIG. 6H)
 The existence of the epitaxial layers does not interfere the processing for interconnects. The drawing shows only the metal contacts (117) and the first metal level (118).

Process Flow for Thick-Film Silicon-On-Insulator (SOI) Substrates

In co-pending patent application Ser. No. 10/399,495 the exemplary process flow shows an implementation with silicon p-type bulk substrates. The following process flow presents an exemplary implementation with thick-film Silicon-On-Insulator (SOI) substrates. These substrates do not change significantly the physics and operation modes of CMOS devices, while providing lower crosstalk between adjacent devices, and lower overall power dissipation.

FIGS. 7A to 7H present an exemplary process flow, implementing the method of fabrication on Thick-Film SOI substrates, in which the epitaxial growth process is also non-selective. In this implementation, the p-substrate is replaced by a "buried oxide", and deep trenches are used, to provide electrical isolation between adjacent "pixel cells".

The exemplary implementation described below, assumes that the CMOS devices are fabricated on n-Wells and p-Wells with conventional lateral sizes and depths, and that the interface between these wells with the buried oxide is located at a depth similar to where the interface with p-Substrate would be. The following exemplary process flow makes use of "deep isolation trenches", extending from the surface of the semiconductor substrate to the buried oxide, thereby providing full electrical isolation between adjacent "pixel cells". Shallow trench isolation is still used inside a "pixel cell" to provide the electrical path to the bottom electrode of the optoelectronic/photonic device, as well as, wherever it might be suitable, outside the "pixel cells".

As with the process flow described in co-pending patent application noted earlier herein, the process flow below assumes standard processing for a given CMOS generation on Thick-Film SOI substrates, until the point at which the epitaxial growth of the layer(s) is to take place. A non-selective epitaxial growth of the photo-diode layers is also shown in this flow.

Using Thick-Film SOI substrates enables the option of removing the silicon substrate underneath the buried oxide, after completion of all processing on the front-side of the wafer. Said silicon substrate can then be replaced, with a variety of substrates, that can be electrical conductors or insulators, transparent or opaque to light.

The attachment of the new mechanical substrate can be achieved through wafer bonding at a low temperature such that does not impact the structures and materials on the front-side of the wafer.

With a new mechanical substrate that is highly conductive, and with the suitable choice of the thickness of the buried oxide, it becomes possible to engineer the capacitance between the n-Wells and p-Wells on the front side of the wafer, and the conductive plate underneath said buried oxide. The capacitor thus formed between the n-Wells and the conductive plate underneath the buried oxide, can be used for similar purposes that the capacitor formed by the n-Well to p-Substrate junction.

The process flow below does not show the option of replacing the silicon substrate with a conductive plate.

On a thick-film silicon-on-insulator substrate, do the following:

1. Define active areas and form p- and n-Wells (FIG. 7A)
   1A. Use shallow trench isolation (102) to define CMOS active areas for NMOS transistors and photo-diodes;
   1B. Use deep trench isolation, reaching the buried oxide (120), to isolate adjacent photo-diodes;
   1C. Form p-Wells (103) for NMOS active areas;
   1D. Form n-Wells (104) for photo-diode active areas, with N-well implant overlapping both side of shallow trench isolation that separates the active areas for the NMOS and for the photo-diode; 1E. Form n-type doped regions (106) over the entire active area for the photo-diode;
2. Form Gates and Junctions of NMOS transistors (FIG. 7B)
   2A. Form gate oxide (107);
   2B. Deposit and pattern poly-silicon gate electrodes (111);
   2C. Perform ion-implantation for LDDs;
   2D. Deposit and etch back silicon nitride to form self-aligned spacers (112) on the side walls of the poly-silicon gates;
   2E. Perform ion-implantation for HDDs and activate dopants through thermal annealing (109);
3. "Pre-epitaxy processing" (FIG. 7C)
   3A. Deposit silicon nitride film (114) to be used as a hard mask for epitaxy. This silicon nitride film is deposited on top of a thin film of silicon oxide, thereby protecting the silicon substrate surface;
   3B. Photolithography, leaving without photo-resist only the regions in which the epitaxial growth of single crystal films is to take place;
   3C. Etch of silicon nitride film, stopping on thin silicon oxide film;
   3D. Photoresist strip and clean;
   3E. Removal of thin oxide from silicon surface, for example with Dilute-HF;
4. "Deposition of Epitaxial Layers" (FIG. 7D)
   4A. Non-selective Epitaxial growth (113) of device layers (ex., in-situ p-type doped SiGeC film);
   4B. Photolithography, leaving without photo-resist only the regions from which it is to be removed the poly-crystalline film, formed by the epitaxial growth over the silicon nitride surface;
   4C. Etch of poly-crystalline film (ex.: poly-SiGeC);
   4D. Photoresist strip and clean;
5. "Patterning of Epitaxial Layers" (FIG. 7E)
   5A. Photolithography, leaving without photo-resist only the regions from which silicon nitride is to be removed;
   5B. Etch of silicon nitride;
   5C. Photoresist strip and clean;
6. "Silicide Module" (FIG. 7F)
   6A. Removal of thin oxide layer from poly-Si lines and junctions (e.g. with Dilute-HF);
   6B. Formation of silicide with conventional methods (115);
7. "Planarization Module" (FIG. 7G)
   7A. Deposition of Pre-Metal Dielectric layer(s) (116);
   7B. Planarization;
8. "Metallization" (FIG. 7H)
   The existence of the epitaxial layers does not interfere the processing for interconnects. The drawing shows only the metal contacts (117) and the first metal level (118).

Process Flow for HBT and/or Photo-HBT

Co-pending patent application Ser. No. 10/399,495 introduced a method of fabrication for the monolithic, and very tight, integration with CMOS, of epitaxial layers and devices made of those epitaxial layers. That method of fabrication is independent of the intended functionality of the epitaxial layers and devices being made.

The next process flow follows the same method of fabrication to make three-terminal bipolar devices, such as Heterojunction Bipolar Devices (HBTs) and/or photo-transistors, such as Photo-HBTs. This is accomplished with a non-selective epitaxial growth step in which two distinct layers are formed, one to be the "Base" and the other to be the "Emitter" of the three-terminal device. The substrate region under the epitaxial films is the "Collector" terminal.

The exemplary process flow below with reference to FIGS. 8A to 8H presents an implementation on bulk silicon p-type substrate. A conducting path to the "Collector" can be formed in the same way they are done for the bottom electrode of a photo-diode (explained earlier in the present disclosure).

On a bulk silicon substrate (101), do the following:
1. Define active areas, form p- and n-Wells of CMOS and "Collector" of HBT (FIG. 8A)
   1A. Use shallow trench isolation (102) to define CMOS active areas for NMOS and HBTs;
   1B. Form p-Wells (103) for NMOS active areas;

1C. Form n-Wells (104) for HBTs active areas, with N-well implant overlapping both side of shallow trench isolation that separates the epitaxial layers from the contact to the bottom electrode (the "Collector");
2. Form Gates and Junctions of NMOS transistors (FIG. 8B)
2A. Form gate oxide (107);
2B. Deposit and pattern poly-silicon gate electrodes (111);
2C. Perform ion-implantation for LDDs;
2D. Deposit and etch back silicon nitride to form self-aligned spacers (112) on the side walls of the poly-silicon gates;
2E. Perform ion-implantation for HDDs and activate dopants through thermal annealing (109);
3. "Base & Emitter Module" (FIG. 8C)
3A. Deposit silicon nitride film (114) to be used as a hard mask for epitaxy. This silicon nitride film is deposited on top of a thin film of silicon oxide, thereby protecting the silicon substrate surface;
3B. Photolithography, leaving without photo-resist only the regions in which the epitaxial growth of single crystal films is to take place;
3C. Etch of silicon nitride film, stopping on thin silicon oxide film;
3D. Photoresist strip and clean;
3E. Removal of thin oxide from silicon surface, for example with Dilute-HF;
3F. Non-selective Epitaxial growth of "Base" layer (113) and of "Emitter" layer (122);
3G. Photolithography, leaving photo-resist only on the regions to have the "Emitter";
3H. Etch of "Emitter" layer, stopping on the "Base" layer;
3I. Photoresist strip and clean;
3J. Photolithography, leaving photo-resist only on the regions to have the "Base";
3K. Etch of "Base" layer, stopping on silicon nitride;
3L. Photoresist strip and clean;
4. "Silicide Module" (FIG. 8E-F)
4A. Deposition of silicon nitride film;
4B. Optional photolithography step to pattern nitride layer;
4C. Etch back (patterned or unpatterned) of silicon nitride to form spacers (112) on the sidewalls of the "Emitter" layer. The etch back removes silicon nitride also from CMOS areas;
4D. Removal of thin oxide layer from poly-Si lines and junctions (e.g. with Dilute-HF);
4E. Formation of silicide with conventional methods (115);
5. "Planarization Module" (FIG. 8G)
5A. Deposition of Pre-Metal Dielectric layer(s) (116);
5B. Planarization;
6. "Metallization" (FIG. 8H)
The existence of the epitaxial layers does not interfere the processing for interconnects. The drawing shows only the metal contacts (117) and the first metal level (118).

Process Flow Multiple Vertically Stacked Optoelectronic/Photonic Devices

The next process flow follows the same method of fabrication described in co-pending patent application Ser. No. 10/399,495 to make three vertically stacked photo-diodes. With suitable doping and heterojunction profiles of the epitaxial layers, optoelectronic/photonic devices composed of different groups of layers, can each selectively absorb certain intervals of wavelengths, for example Red, Green and Blue. Given the ability to incorporate materials other than pure silicon, it is possible to engineer the bandgaps and doping profiles of the different layers to extend the selective photo-absorption to regions of the spectrum that are not reachable with pure silicon, such as the Short Wavelength Infra-Red (SWIR), including the 1.55 µm wavelength, which is highly relevant for fiber optics communications.

The epitaxial layers can be engineered to use or not to use the substrate for the purpose of photo-absorption. The exemplary process flow below shows an implementation on bulk silicon p-type substrates, and without making use of the substrate for photo-absorption.

It should be obvious that in addition to the very different method of fabrication, the multi-layer, vertically stacked photo-diodes themselves are also very different from the vertically stacked photo-diodes of U.S. Pat. No. 5,965,875 and U.S. patent application 20020101895/A1, Aug. 1, 2002.

The vertically stacked photo-diodes of U.S. Pat. No. 5,965,875 are fabricated by engineering doping profiles into the semiconductor substrate, through conventional ion-implantation and annealing techniques. There are no epitaxial steps involved, and heterojunction photo-diodes are made according to different methods, relying on ion-implantation of doping impurities, rather than low temperature epitaxy of precise doping and heterojunction profiles.

The following exemplary process flow is described with reference to FIGS. 9A to 9J.

Figure 9A:
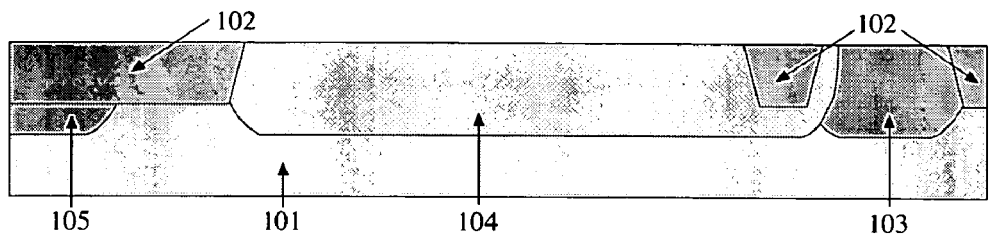
FIG. 9A to 9J, show a process flow identical to that described in FIG. 6A to 6F, except that the epitaxial layer comprises several layers, with suitable doping and bandgap engineering, resulting in vertically stacked distinct photo-diodes, each capturing a restricted range of wavelengths.
Figure 9B:
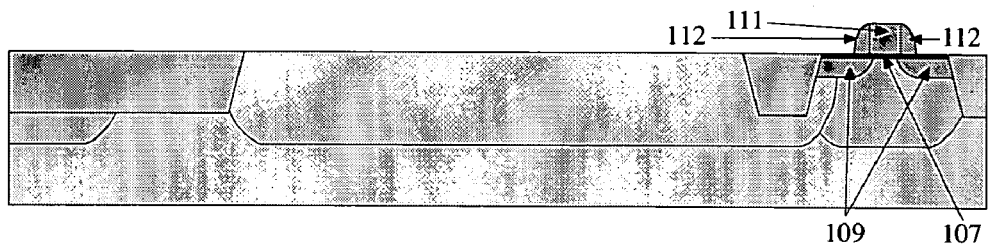
Figure 9C:
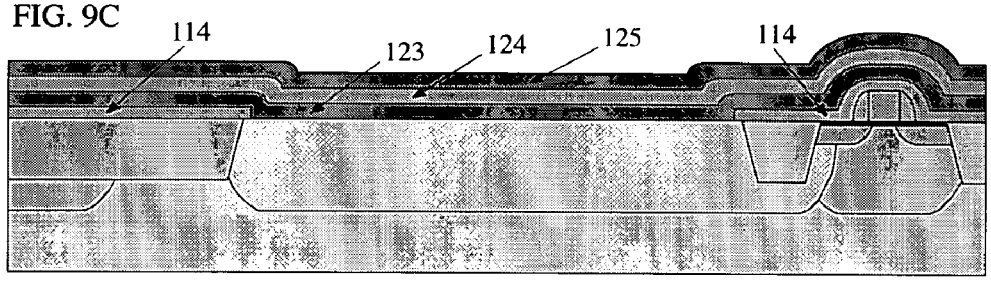
Figure 9D:
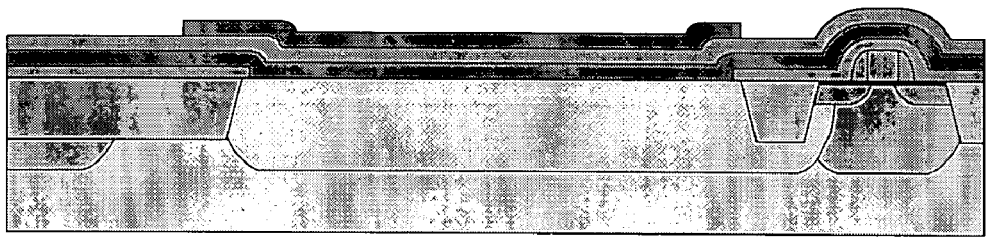
Figure 9E:
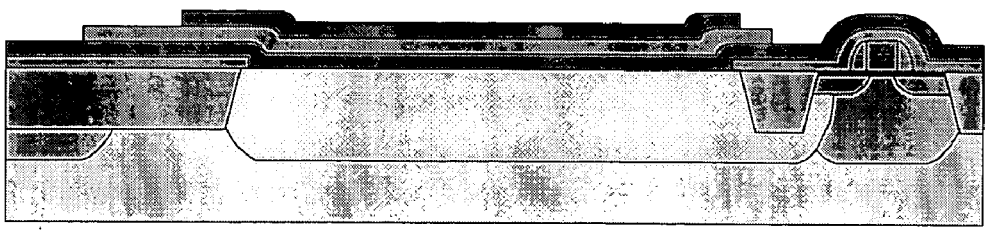
Figure 9F:
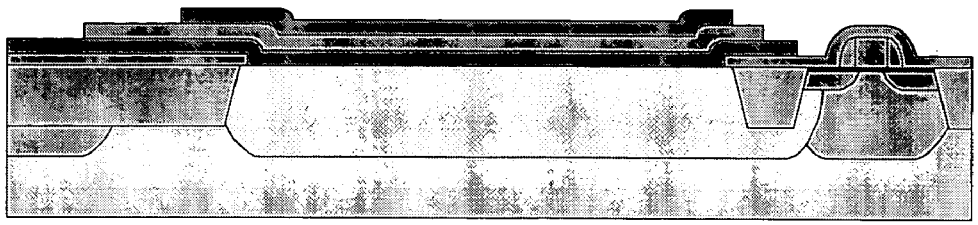
Figure 9G:
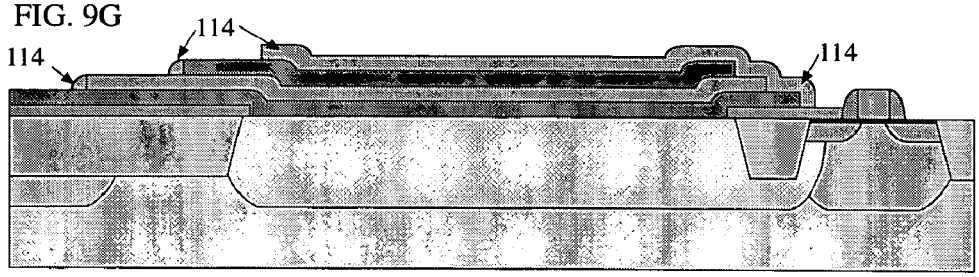
Figure 9H:
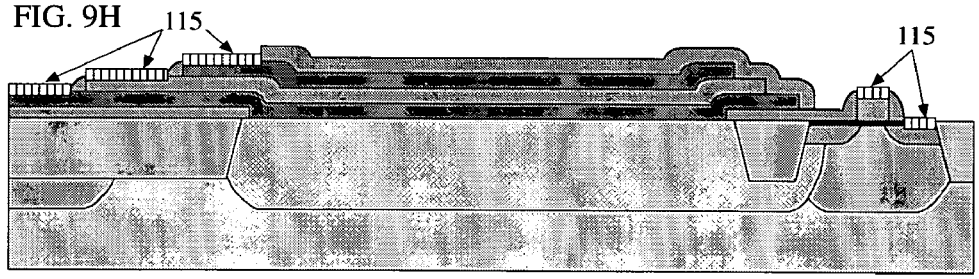
Figure 9I:
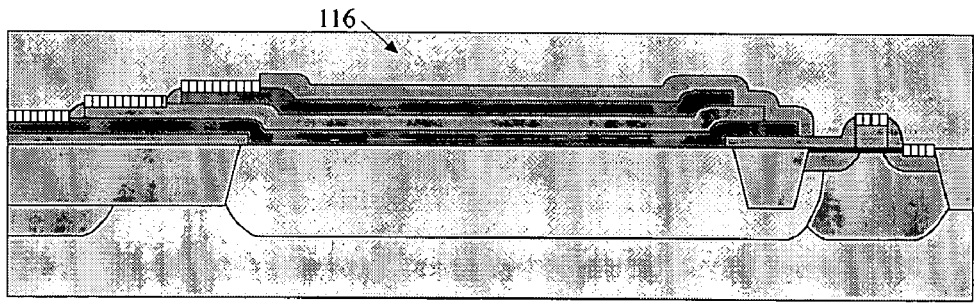
Figure 9J:
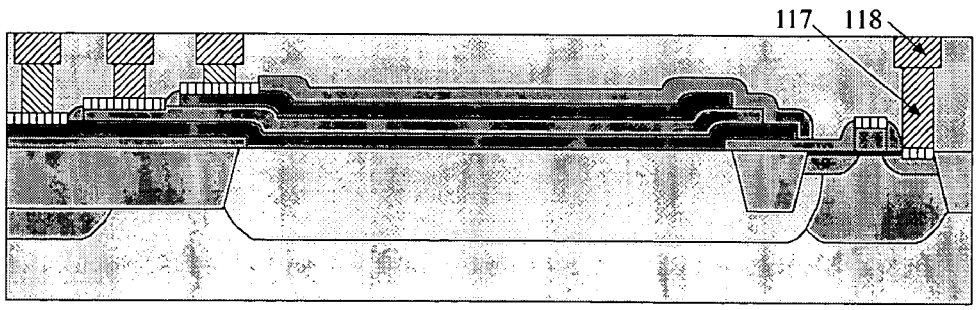

On a bulk silicon substrate (101), do the following:
1. Define active areas and form p- and n-Wells (FIG. 9A)
1A. Use shallow trench isolation (102) to define CMOS active areas for NMOS transistors and photo-diodes;
1B. Form p-Wells (103) for NMOS active areas;
1C. Form n-Wells (104) for photo-diode active areas, with N-well implant overlapping both side of shallow trench isolation that separates the active areas for the NMOS and for the photo-diode;
1D. Form p-type doped regions (105), isolating adjacent photo-diode active areas;
2. Form Gates and Junctions of NMOS transistors (FIG. 9B)
2A. Form gate oxide (107);
2B. Deposit and pattern poly-silicon gate electrodes (111);
2C. Perform ion-implantation for LDDs;
2D. Deposit and etch back silicon nitride to form self-aligned spacers (112) on the side walls of the poly-silicon gates;
2E. Perform ion-implantation for HDDs and activate dopants through thermal annealing (109);
3. "Light-Sensing Module" (FIG. 9C-F)
3A. Deposit silicon nitride film (114) to be used as a hard mask for epitaxy. This silicon nitride film is deposited on top of a thin film of silicon oxide, thereby protecting the silicon substrate surface;
3B. Photolithography, leaving without photo-resist only the regions in which the epitaxial growth of single crystal films is to take place;
3C. Etch of silicon nitride film, stopping on thin silicon oxide film;
3D. Photoresist strip and clean;
3E. Removal of thin oxide from silicon surface, for example with Dilute-HF;
3F. Non-selective Epitaxial growth of multiple (ex.: 3) for light sensing (123), (124) and (125);
3G. Photolithography, leaving photo-resist only on the regions to have the top light-sensing layer (125);
3H. Etch of top light-sensing layer (125), stopping on the middle light sensing layer (124);

3I. Photoresist strip and clean;
3J. Photolithography, leaving photo-resist only on the regions to have the middle light-sensing layer (124);
3K. Etch of middle light-sensing layer (124), stopping on the bottom light-sensing layer (123);
3L. Photoresist strip and clean;
3M. Photolithography, leaving photo-resist only on the regions to have the bottom light-sensing layer (123);
3N. Etch of bottom light-sensing layer (123), stopping on the bottom silicon nitride layer (114);
3O. Photoresist strip and clean;
4. "Silicide Module" (FIG. 9G-H)
4A. Deposition of silicon nitride film;
4B. Photolithography step to pattern nitride layer, leaving resist where silicide is not to be formed;
4C. Patterned etch of silicon nitride, forming spacers on the side walls of the light-sensing layers (114);
4D. Removal of thin oxide layer from poly-Si lines and junctions (e.g. with Dilute-HF);
4E. Formation of silicide with conventional methods (115);
5. "Planarization Module" (FIG. 9I)
5A. Deposition of Pre-Metal Dielectric layer(s) (116);
5B. Planarization;
6. "Metallization" (FIG. 9J)

The existence of the epitaxial layers does not interfere the processing for interconnects. The drawing shows only the metal contacts (117) and the first metal level (118).

Comments on Substrate Materials and Process Flows

It should be realized that for each of the exemplary process flows described in the present disclosure there are many possible small variations that are obvious to anyone skilled in the art, and that are within the scope of the present invention, as well as of co-pending patent application Ser. No. 10/399,495.

The exemplary implementations provided in said co-pending patent application and in the present disclosure typically show a starting substrate that is a p-type silicon wafer. It is obvious for anyone skilled in the art, and therefore within the scope of the present disclosure, to adapt the process flows to implement the method of fabrication to other starting substrates, such as n-type silicon wafers.

It should also be realized that the invention of co-pending patent application Ser. No. 10/399,495 as well as the present disclosure can easily be implemented with bulk germanium or thick-film germanium-on-insulator substrates, with minimal adaptations to the process flows, that are obvious to anyone skilled in the art.

What is claimed is:

1. A method of fabricating a heterojunction device module monolithically integrated with a CMOS structure in a semiconductor substrate, comprising the steps of:
(a) In said semiconductor substrate, forming at least one heterojunction device active area surrounded by field oxide (FOX) regions, employing any of the conventional isolation technologies used in CMOS processes, said heterojunction active area containing at least one embedded well semiconductor region of a defined polarity implanted therein, said embedded semiconductor well being surrounded laterally at least on one side and underneath by semiconductor regions implanted with doping impurities of the opposite polarity, and having lateral dimensions such that said embedded well can be biased independently from other neighbouring embedded wells, said embedded semiconductor well extending itself under a selected portion of the surrounding field oxide regions and overlapping at least a fraction of a selected adjacent active area, said overlapped fraction of adjacent active area including a surface region with high doping concentration of the same polarity of the embedded semiconductor well;
(b) formation of key regions of MOSFET devices, including growth and/or deposition of gate dielectric, deposition and patterning of gate electrode, ion-implantation of lightly-doped source/drain (LDD) regions
(c) epitaxially growing the heterojunction device layers on said at least one heterojunction active area;
(d) forming dielectric spacers, followed by ion-implantation of high-doped source/drain (HDD) regions of MOSFET devices;
(e) forming an ohmic contact region on at least one selected area of each of said epitaxially grown heterojunction device layers;
(f) forming a planarized dielectric layer over the entire substrate;and
(g) forming a columnar metal interconnect layer on top of each selected area of said epitaxially grown heterojunction device layers.

2. A method of fabricating a heterojunction device module monolithically with a CMOS structure in a bulk semiconductor substrate, comprising the steps of:
(a) in said semiconductor substate, forming at least one heterojunction device active area surrounded by field oxide (FOX)regions, employing any of the conventional isolation technologies used in CMOS processes, said heterojunction active area containing at least one embedded well semiconductor region of a defined polarity implanted therein, said embedded semiconductor well being surrounded laterally at least one side by semiconductor regions implanted with doping impurities of the opposite polarity and having lateral dimensions such that said embedded well can be bias independently from other neighbouring embedded wells, said embedded semiconductor well extending itself under a selected portion of the surrounding filed oxide regions and overlapping at least a fraction of a selected adjacent active area, said overlapping fraction of adjacent active area including a surface region with high doping concentration of the same polarity of the embedded semiconductor well;
formation of key regions of MOSFET devices, including growth and/or deposition of gate dialectric, deposition and patterning of gate electrode, ion-implantation of lightly-doped source/drain (LDD) regions;
formation of dialectric spacers, followed by the ion-implantation of high-doped source/drain (HDD) regions of MOSFET devices;
epitaxially growing the heterojunction device layers on at least one heterojunction active area;
forming an ohmic contact region on at least one selected area of each of said epitaxially grown heterojunction device layers;
forming a planarized dielectric layer over the entire substrate;and
forming a columnar metal interconnect layer on top of each selected area of said epitaxially grown heterojunction device layer.

3. The method of claim 1 or 2, wherein said overlapped fraction of adjacent active area by the embedded well, is part of the source/drain region of a MOSFET.

4. The method of claim 1 or 2, wherein said overlapped fraction of adjacent active area, by the embedded well, includes a surface region with the same polarity of said semiconductor well, having a high doping concentration, suitable for the formation of an ohmic contact such as that provided by a silicide.

5. The method of claim 1 or 2, wherein said contact layer to the epitaxially grown heterojunction device layers is an opaque conducting material.

6. The method of claim 1 or 2, wherein said contact layer to the epitaxially grown heterojunction device layers is a transparent conducting material.

7. The method of claim 1 or 2, wherein the epitaxial growth of the heterojunction device layers is non-selective and wherein the epitaxial layer contacts individually each one of a plurality of heterojunction devices.

8. The method of claim 1 or 2, wherein the epitaxial growth of the heterojunction device layers is non-selective and wherein the epitaxial layer contacts a plurality of heterojunction devices in parallel.

9. The method of claim 1 or 2, wherein the epitaxial growth of the heterojunction device layers is selective and wherein each epitaxial layer contacts individually each one of a plurality of heterojunction devices.

10. The method of claim 1 or 2, wherein the epitaxial growth of the heterojunction device layers forms two distinct layers to serve as to terminals of a three-terminal device.

11. The method of claim 1 or 2, where in the epitaxial growth forms a plurality of layers with separate ohmic contacts to each layer, thereby forming a plurality of vertically stacked devices.

12. The method of claim 1 or 2, implemented on a Thick-Film Silicon-On-Insulator staffing substrate, wherein all p-type and n-type embedded wells, including said embedded wells underneath epitaxial heterojunction device layers, reach the buried insulator (oxide), and wherein said embedded wells underneath other epitaxial heterojunction device layers, are separated from adjacent embedded well underneath other epitaxial heterojunction device layers, by deep isolation trenches extending from the surface of the silicon-on-insulator film down to the buried insulator.

13. The method of claim 1 or 2, implemented on a Thick-Film Silicon-On-Insulator starting substrate, wherein after finishing the entire processing of the front-side of the wafer, the silicon mechanical substrate underneath the buried insulator is replaced by an opaque or transparent conductive material.

14. The method of claim 1 or 2, implemented on a Thick-Film Silicon-On-Insulator substrate with a conductive plate underneath the buried insulator, providing capacitive coupling to each individual embedded well underneath epitaxial heterojunction layers.

15. The method of claim 1 or 2, applied to bulk semiconductor substrates, wherein said embedded well is surrounded on all sides and underneath by semiconductor regions implanted with doping impurities of the opposite polarity and have lateral dimensions such that said embedded well can be biased independently from other neighbouring embedded wells.

16. The method of claim 1 or 2, applied to Thick-Film SOI substrates, wherein said embedded well is surrounded on one side by a semiconductor region implanted with doping impurities of the opposite polarity, on the other sides and underneath is surrounded by insulator regions and said embedded well can be biased independently from other neighbouring embedded wells.

17. The method of claim 1 or 2, comprising patterning the epitaxially grown heterojunction device layers before forming the ohmic contact region(s).

18. The method of claim 1 or 2, wherein the epitaxial growth of the heterojunction device layers is selective and wherein the epitaxial layer contacts a plurality of heterojunction devices in parallel.

19. The method of claim 1 or 2, implemented on a Thick-Film Silicon-On-Insulator staffing substrate, wherein all p-type and n-type embedded wells, including said embedded wells underneath epitaxial heterojunction device layers, reach the buried insulator, said embedded wells underneath other epitaxial heterojunction device layers being separated from adjacent embedded well underneath other epitaxial heterojunction device layers by deep isolation trenches extending from the surface of the silicon-on-insulator film down to the buried insulator, and wherein the epitaxial growth of the heterojunction device layers forms two distinct layers to serve as two terminals of a three-terminal device.

20. The method of claim 1 or 2, implemented on a Thick-Film Silicon-On-Insulator starting substrate, wherein all p-type and n-type embedded wells, including said embedded wells underneath epitaxial heterojunction device layers, reach the buried insulator, said embedded wells underneath other epitaxial heterojunction device layers being separated from adjacent embedded well underneath other epitaxial heterojunction device layers by deep isolation trenches extending from the surface of the silicon-on-insulator film down to the buried insulator and wherein the epitaxial growth of the heterojunction device layers forms a plurality of layers with separate ohmic contacts to each layer, thereby forming a plurality of vertically stacked devices.

21. The method of claim 1 or 2, implemented on a Thick-Film Silicon-On-Insulator staffing substrate, wherein after finishing the entire processing of the front-side of the wafer, the silicon mechanical substrate underneath the buried insulator is replaced by an opaque or transparent conductive material, and wherein the epitaxial growth of the heterojunction device layers forms two distinct layers to serve as two terminals of a three-terminal device.

22. The method of claim 1 or 2, implemented on a Thick-Film Silicon-On-Insulator staffing substrate, wherein after finishing the entire processing of the front-side of the wafer, the silicon mechanical substrate underneath the buried insulator is replaced by an opaque or transparent conductive material, and wherein the epitaxial growth of the heterojunction device layers forms a plurality of layers with separate ohmic contacts to each layer, thereby forming a plurality of vertically stacked devices.

23. The method of claim 1 or 2, implemented on a Thick-Film Silicon-On-Insulator substrate with a conductive plate underneath the buried insulator, providing capacitive coupling to each individual embedded well underneath epitaxial heterojunction layers, wherein the epitaxial growth of the heterojunction device layers forms two distinct layers to serve as two terminals of a three-terminal device.

24. The method of claim 1 or 2, implemented on a Thick-Film Silicon-On-Insulator substrate with a conductive plate underneath the buried insulator, providing capacitive coupling to each individual embedded well underneath epitaxial heterojunction layers, wherein the epitaxial growth of the heterojunction device layers forms a plurality of layers with separate ohmic contacts to each layer, thereby forming a plurality of vertically stacked devices.

25. The method of claim 1 or 2, applied to Thick-Film SOI substrates, wherein said embedded well is surrounded on one side by a semiconductor region implanted with doping impurities of the opposite polarity, on the other sides and underneath is surrounded by insulator regions and said embedded well can be biased independently from other neighbouring embedded wells, and wherein the epitaxial growth of the heterojunction device layers forms two distinct layers to serve as two terminals of a three-terminal device.

26. The method of claim 1 or 2, applied to Thick-Film SOI substrates, wherein said embedded well is surrounded on one side by a semiconductor region implanted with doping impurities of the opposite polarity, on the other sides and underneath is surrounded by insulator regions and said embedded well can be biased independently from other neighbouring embedded wells, and wherein the epitaxial growth of the heterojunction device layers forms a plurality of layers with separate ohmic contacts to each layer, thereby forming a plurality of vertically stacked devices.

* * * * *